(12) United States Patent
Ozaki et al.

(10) Patent No.: US 8,618,423 B2
(45) Date of Patent: Dec. 31, 2013

(54) MOUNTING BOARD INCLUDING A FLAT-TYPE ELECTRICAL ELEMENT AND CAPABLE OF BEING REDUCED IN SIZE, AND LEAD-ATTACHED ELECTRIC ELEMENT THAT IS FLAT IN SHAPE AND HAS A LEAD BONDED TO EACH ELECTRODE FACE

(75) Inventors: Hirotoshi Ozaki, Osaka (JP); Akiko Morimoto, Osaka (JP); Tetsuya Yamashita, Osaka (JP)

(73) Assignees: SANYO Electric Co., Ltd., Moriguchi-shi, Osaka (JP); SANYO Energy Tottori Co., Ltd, Moriguchi-shi, Osaka (JP)

( * ) Notice: Subject to any disclaimer, the term of this patent is extended or adjusted under 35 U.S.C. 154(b) by 1217 days.

(21) Appl. No.: 12/056,854

(22) Filed: Mar. 27, 2008

(65) Prior Publication Data

US 2008/0236880 A1    Oct. 2, 2008

(30) Foreign Application Priority Data

Mar. 28, 2007   (JP) .................................. 2007-84112

(51) Int. Cl.
  *H05K 1/00*   (2006.01)
(52) U.S. Cl.
  USPC ........................................ 174/262; 174/94 R
(58) Field of Classification Search
  USPC ............ 174/260, 262, 267, 94 R; 439/78, 82; 429/178
  See application file for complete search history.

(56) References Cited

U.S. PATENT DOCUMENTS 3,114,080 A * 12/1963 Koda et al. ..................... 361/762
4,541,034 A *  9/1985 Fanning ......................... 361/773
5,460,319 A * 10/1995 Kato ............................. 228/180.1
6,555,742 B2 *  4/2003 Kumagai ............................. 174/6
6,676,440 B1   1/2004 Inamine et al.

FOREIGN PATENT DOCUMENTS

| JP | 59-134267 U | | 9/1984 |
| JP | 62-018928 U | | 2/1987 |
| JP | 62-211857 | * | 9/1987 |
| JP | 7-010973 A | | 2/1995 |
| JP | 10-093218 A | | 4/1998 |
| JP | 2002-298804 A | | 10/2002 |

OTHER PUBLICATIONS

Japanese Office Action dated Oct. 25, 2011, issued in corresponding Japanese Patent Application No. 2007-084112.

* cited by examiner

*Primary Examiner* — Chau Nguyen
(74) *Attorney, Agent, or Firm* — Westerman, Hattori, Daniels & Adrian, LLP

(57) ABSTRACT

A lead-attached electrical element and a mounting board to which the lead-attached electrical element is mounted both contribute to a reduction in the size of the mounting board as well as facilitate rework. The lead-attached electrical element is constituted from an electrical element and two leads. Each lead includes a main portion which is bonded to a respective electrode face of the electrical element, and a bent portion which is inclined with respect to the main portion. The mounting board is constituted from a PC (printed circuit) board and the lead-attached electrical element. Two conductive lands are provided on a surface of the PC board. The lead-attached electrical element has been inserted into an aperture in the PC board, and bent portions of the leads attached to the electrical element are bonded to the conductive lands so that the electrical element is suspended in the aperture by the leads.

10 Claims, 7 Drawing Sheets

31

33

MOUNTING BOARD INCLUDING A FLAT-TYPE ELECTRICAL ELEMENT AND CAPABLE OF BEING REDUCED IN SIZE, AND LEAD-ATTACHED ELECTRIC ELEMENT THAT IS FLAT IN SHAPE AND HAS A LEAD BONDED TO EACH ELECTRODE FACE

This application is based on an application No. 2007-084112 filed in Japan, the content of which is hereby incorporated by reference.

BACKGROUND OF THE INVENTION

1. Field of the Invention

The present invention relates to a mounting board composed of a PC (printed circuit) board on which a flat-type electrical element is mounted, and a lead-attached electrical element that is flat in shape and has a lead bonded to each electrode face. The present invention relates particularly to technology for an improved structure for mounting the electrical element to the PC board, taking into account reductions in size.

2. Description of the Related Art

Conventionally, mounting boards including a microcomputer, memory, etc. often have a flat-type electrical element such as a battery or capacitor mounted thereon as a backup power supply. The term "flat-type electrical element" includes so-called "coin-type" and "button-type" electrical elements. Generally, one end of a lead is connected to the cathode face of the electrical element, and one end of another lead is connected to the anode face. The other end of each lead is soldered to the PC board, thereby mounting the electrical element to the PC board.

In recent years, there has been demand for reduced-size electrical equipment, which has lead to demand for reduced-size mounting boards. One strategy for meeting this demand includes various methods of mounting an electrical element to a mounting board so as to reduce the area occupied by the electrical element (occupied area) on the main face of the mounting board when viewed from above in a direction perpendicular to the main face of the mounting board.

For example, there is technology for soldering one main face (one electrode) of a flat-type battery directly to a conductive land on a PC board, thereby reducing the number of leads that are required and reducing the area occupied by the flat-type battery on the PC board (see Japanese Patent Application Publication No. 2002-298804).

After mounting an electrical element to a PC board in the above manner, in general the condition of the mounted electrical element is tested. If any sort of defect is found in the mounted electrical element, the electrical element must be detached from the mounting board. Specifically, an operator detaches each defective element separately by hand, by bringing a soldering iron into contact with the electrical element or lead that is soldered to the PC board in order to melt the solder. A new electrical element must then be re-soldered to a predetermined position on the PC board. This process is called rework.

SUMMARY OF THE INVENTION

However, performing such rework has the following problems. In conventional cases in which a flat-type battery is directly soldered to a conductive land on a mounting board, it is very troublesome to detach the flat-type battery after it has been mounted to the mounting board.

Specifically, since the flat-type battery has been mounted by being soldered directly to the PC board, it is difficult to bring the soldering iron into contact with the solder bond in order to melt the solder, which makes detaching the flat-type battery very troublesome. Rework is therefore difficult in the case of mounting boards having this type of structure.

This problem is not limited to batteries. The same problem arises with other electrical elements such as flat-type capacitors, and therefore there is desire for this problem to be solved quickly.

The present invention has been achieved in view of the above problems, and an aim thereof is to provide a lead-attached electrical element and a mounting board to which the lead-attached electrical element is mounted, both of which contribute to a reduction in the size of the mounting board as well as facilitate rework such as detaching the electrical element when necessary.

In order to achieve the above aim, a mounting board of the present invention includes: a printed circuit board having two conductive lands provided on a surface thereof, and having an aperture provided in a thickness direction of the printed circuit board; an electrical element that is flat in shape and has two surfaces, each surface being provided with an electrode face; and two leads, each including (i) a main portion that is bonded to a respective one of the electrode faces and (ii) a bent portion that is inclined with respect to the main portion and is bonded to a respective one of the conductive lands, wherein the electrical element has been inserted into the aperture and is suspended therein by the two leads.

According to the above structure of the mounting board of the present invention, the bent portions of the leads are visible when the mounting board is viewed from above in a direction perpendicular to the surface of the mounting board. In other words, the bent portions are not sandwiched between the electrical element and the PC board. This structure makes it easy for an operator to bring a soldering iron into contact with the solder bond (the bent portions) to melt the solder, thereby facilitating the removal of the electrical element. This structure therefore facilitates rework.

Also, each of the leads includes a main portion that is joined to a respective electrode face of the electrical element, and a bent portion that is inclined with respect to the main portion and bonded to a respective one of the conductive lands. The electrical element is therefore suspended such that the electrode faces intersect the surface of the PC board. This structure reduces the area occupied by the electrical element on the PC board, over a case in which an electrical element is arranged parallel to the surface of a PC board.

When an electrical element is arranged so that the electrode faces intersect the surface of a PC board, the mounting board readily becomes bulky in thickness. However, in the present embodiment, the electrical element is inserted into the aperture in the PC board and suspended therein via the leads, thereby effectively utilizing the thickness of the PC board to suppress the electrical element from being bulky in the thickness direction of the mounting board. In other words, the present embodiment enables suppressing an increase in the envelope volume of the mounting board.

In this way, the mounting board of the present invention facilitates rework as well as enables a reduction in size.

At least one of the leads may further include an extending portion that extends to an area outward of a periphery of each electrode face, and the extending portion may include a top-plate portion that has been formed by bending an end of the extending portion in a direction that intersects an extending direction of the extending portion. In this case, the top-plate portion can be used as a grip/handle. When mounting the electrical element to the PC board, it is therefore possible to, for example, use an automatic-controlled suction nozzle to suction the electrical element and automatically mount it to the PC board. This structure contributes to a reduction in production time in manufacturing method for the mounting board.

Also, the bent portion of at least one of the leads may have been formed by cutting and bending a rectangular plate, the bent portion of the at least one of the leads may have an aperture provided therein, and a plating layer may have been formed on a main face of the bent portion of the at least one of the leads and on an inner wall of the aperture provided therein. According to this structure including such an aperture, in a case of forming the bent portion by performing plating processing on the portion of the rectangular plate in which the aperture is provided and thereafter cutting and bending the plated portion, the plating processing has been performed on the inner walls of the aperture. Forming the bent portion in this way enables the lead to be stored in a flat state after plating processing has been performed on the rectangular plate, which is beneficial in the manufacturing method. In other words, if the manufacturing method is temporarily stopped, the rectangular plate can be stored in a state of not having any protrusions etc., thereby reducing the danger of damage during storage. Also, since the plating processing has been performed on the inner walls of the aperture, the bent portion can be favorably bonded to the conductive land during solder bonding.

Providing the aperture in the portion of the lead that is to be bent, before the bending is performed, enables improving mass-productivity and yield.

BRIEF DESCRIPTION OF THE DRAWINGS

These and other objects, advantages, and features of the invention will become apparent from the following description thereof taken in conjunction with the accompanying drawings, which illustrate specific embodiments of the present invention.

In the drawings.

DESCRIPTION OF THE PREFERRED EMBODIMENTS

A lead-attached electrical element of the present invention and a mounting board of the present invention on which the lead-attached electrical element is mounted are described below, taking the example of a coin-type battery. The present invention, however, is not limited to the structures described in the following embodiments.

Embodiment 1

Figure 1A:
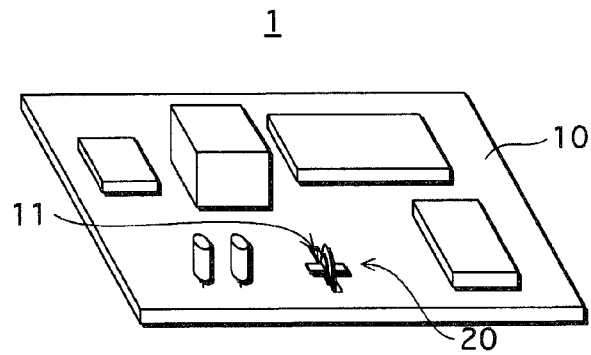
FIG. 1A is a perspective view of a mounting board pertaining to embodiment 1.

As shown in FIG. 1A, a mounting board 1 of the present embodiment is constituted from a PC (printed circuit) board 10 and a lead-attached coin-type battery 20.

The PC board 10 is made of a composite material. An aperture 11 has been provided in a main face of the PC board 10 at a predetermined position for the insertion of the lead-attached coin-type battery 20.

Figure 1B:
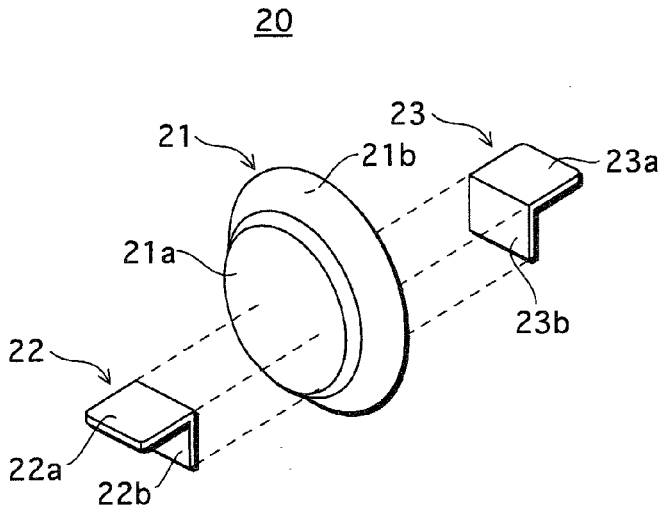
FIG. 1B is an exploded perspective view of a lead-attached coin-type battery pertaining to embodiment 1.

As shown in FIG. 1B, the lead-attached coin-type battery 20 is constituted from a coin-type battery 21 and two leads 22 and 23 bonded thereto.

In the present embodiment, the coin-type battery 21 has a known structure (e.g., a coin-type lithium secondary battery having a thickness of 1.0 [mm] and a diameter of 4.8 [mm]).

As shown in FIG. 1B, the coin-type battery 21 is a flat disk, where one main face is a cathode face 21*a* and the other main face is an anode face 21*b*.

The leads 22 and 23 are each an elongated plate made of a metal material such as phosphor bronze, and are constituted from main portions 22*b* and 23*b* (hereinafter, called "bottom portions 22*b* and 23*b*") and bent portions 22*a* and 23*a* respectively. The bent portions 22*a* and 23*a* have been formed by bending the material of the leads 22 and 23 so as to be angled with respect to the bottom portions 22*b* and 23*b*. The bottom portions 22*b* and 23*b* are directly bonded to the coin-type battery 21. A plating layer has been formed on the surface of the bent portions 22*a* and 23*a*. The plating layer has been provided for favorable solder bonding when the lead-attached coin-type battery 20 is mounted on the PC board 10.

The bent portions 22*a* and 23*a* are inward of the edges of the cathode face 21*a* and anode face 21*b* of the coin-type battery 21. Also, the bent portions 22*a* and 23*a* each have a substantially horizontal surface, that is to say, they both exist on the same virtual plane. In the present embodiment, the bent portions 22*a* and 23*a* have been bent so as to be substantially orthogonal to the bottom portions 22*b* and 23*b* respectively. Also, the positions of the bent portions 22*a* and 23*a* are set at opposing positions that sandwich the coin-type battery 21 therebetween.

A known bonding method such as resistance welding may be used to bond the bottom portions 22*b* and 23*b* to the respective cathode face 21*a* and anode face 21*b* of the coin-type battery 21.

Figure 1C:
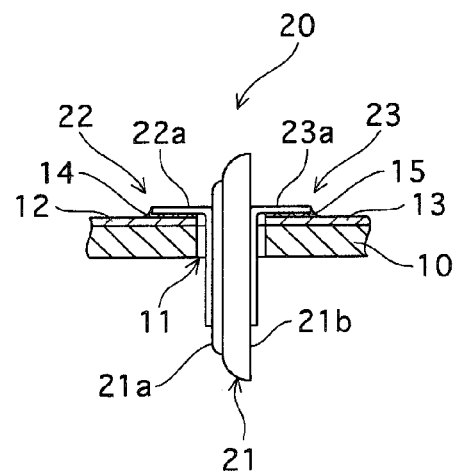
FIG. 1C is a partial cross-sectional view of the mounting board pertaining to embodiment 1.

As shown in FIG. 1C, conductive lands 12 and 13, which are to be points of electrical contact for the PC board 10, are provided on the main face of the PC board 10 up to the edge of the aperture 11.

In the present invention, it is not necessary for the conductive lands 12 and 13 to be provided up to the edge of the aperture 11. However, such a structure has the advantages of enabling a reduction in size for the bent portions 22*a* and 23*a*, and contributing to a reduction in the mounting area.

The coin-type battery 21 is partially inserted into the aperture 11 so that the bent portions 22*a* and 23*a* of the leads 22 and 23 overlap the conductive lands 12 and 13 respectively, and solder 14 and 15 is used to bond the bent portions 22*a* and 23a to the conductive lands 12 and 13 respectively. Accordingly, the coin-type battery 21 is suspended via the leads 22 and 23 so as to intersect the PC board 10. Specifically, the coin-type battery 21 is suspended so that the cathode face 21a and anode face 21b are orthogonal to the main face of the PC board 10.

The following describes an exemplary method for mounting the lead-attached coin-type battery 20 to the PC board 10.

First, an operator prepares the PC board 10 provided with the aperture 11 and the two conductive lands 12 and 13 provided up to the edge of the aperture 11.

Next, solder 14 and 15 is adhered to the main face of the conductive lands 12 and 13, at the edge of the aperture 11 and a vicinity thereof. Specifically, a desired thickness of cream solder is applied to the main face of the conductive lands 12 and 13.

Then the operator inserts the coin-type battery 21 into the aperture 11 of the PC board 10 so that a main face of the bent portions 22a and 23a of the leads 22 and 23 oppose the main face of the solder 14 and 15 respectively. As a result, the cathode face 21a and anode face 21b of the coin-type battery 21 is in a state of being orthogonal to the main face of the PC board 10. While maintaining this state, the bent portions 22a and 23a of the leads 22 and 23 are brought into contact with the solder 14 and 15. Due to having horizontal surfaces, the bent portions 22a and 23a can be placed and held stably on the solder 14 and 15.

Thereafter, the PC board 10 is inserted into a reflow furnace and heating is performed at a predetermined temperature to cause the solder 14 and 15 to melt. The PC board 10 is then removed from the reflow furnace and the solder is hardened, thereby completing the solder bonding.

When the mounting board 1 of the present embodiment is manufactured by the above method using the lead-attached coin-type battery 20 whose structure is described above, the mounting board 1 has a structure in which the bent portions 22a and 23a of the leads 22 and 23 are visible when the mounting board 1 is viewed from above in a direction perpendicular to the main face. In other words, the bent portions 22a and 23a are not sandwiched between the coin-type battery 21 and the PC board 10.

This structure makes it easier for the operator to bring the soldering iron into contact with the solder bond (the bent portions 22a and 23a) to melt the solder, and enables the lead-attached coin-type battery 20 to be easily removed after it has been mounted to the PC board 10. This structure therefore facilitates rework.

Also, the coin-type battery 21 is suspended so that the cathode face 21a and anode face 21b are substantially orthogonal to the main face of the PC board 10. The present embodiment therefore reduces the area occupied by the lead-attached coin-type battery 20 on the PC board 10, over a case in which a flat-type electrical element such as a coin-type battery is arranged parallel to the main face of a PC board.

Normally, when the main face of a flat-type electrical element such as a coin-type battery is arranged orthogonal to the main face of a PC board, the mounting board readily becomes bulky in thickness. However, in the present embodiment, the coin-type battery 21 is inserted into the aperture 11 of the PC board 10 and suspended therein via the leads 22 and 23, thereby effectively utilizing the thickness of the PC board 10 to suppress the coin-type battery 21 from being bulky in the thickness direction of the mounting board 1. In other words, the present embodiment enables suppressing an increase in the envelope volume of the mounting board 1.

In this way, the mounting board 1 of the present embodiment has the effect of facilitating rework, as well as the effect of being applicable when there is a demand for a reduction in the size of the mounting board.

Also, in the present embodiment, both of the bent portions 22a and 23a are on the main face side of the PC board 10. As a result, when mounting the lead-attached coin-type battery 20 to the PC board 10, solder bonding can be reliably performed by not only soldering using a soldering iron, but also by employing a reflow soldering method, thereby expanding the number of mounting method options.

Furthermore, in the present embodiment, the bent portions 22a and 23a of the leads 22 and 23 both have a horizontal surface. Therefore, when inserting the coin-type battery 21 into the aperture 11, the lead-attached coin-type battery 20 can be mounted on the flat PC board 10 in a stable position. Note that instead of being limited to plate materials, the leads 22 and 23 can be linear materials. However, using plate materials for the leads 22 and 23 is preferable due to ensuring a larger area contributing to solder bonding than when linear materials are used, and obtaining favorable solder bonding strength.

Below are descriptions of other embodiments, focusing on characteristic portions therein.

Embodiment 2

Embodiment 2 differs from embodiment 1 with respect to the following three points. Firstly, the bent portion of one of the leads is formed by cutting and bending a portion of a rectangular plate. Secondly, an aperture is provided in this bent portion. Thirdly, this lead extends beyond the outer periphery of a main face of the coin-type battery, and a top-plate portion is provided by bending the extending portion of the lead.

Figure 2A:
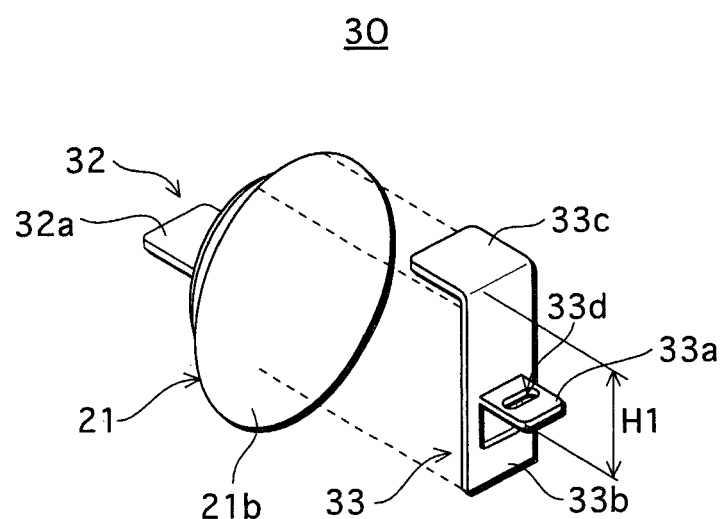
FIG. 2A is an assembly view of a lead-attached coin-type battery pertaining to embodiment 2.
Figure 2B:
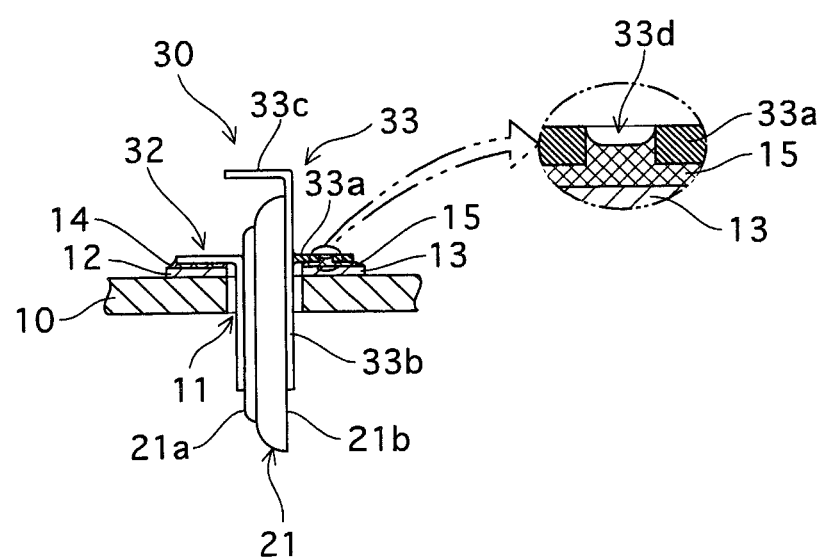
FIG. 2B is a partial cross-sectional view of a mounting board pertaining to embodiment 2.
Figure 3A:
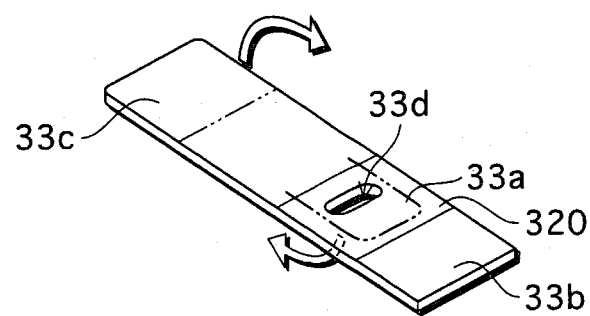
FIG. 3A shows a relevant step in a manufacturing method for a lead pertaining to embodiment 2.
Figure 3B:
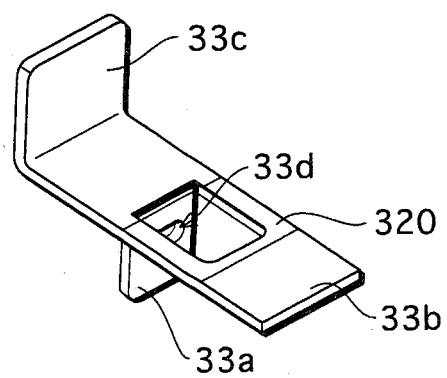
FIG. 3B shows a completed lead.

A lead 33 is constituted from a rectangular plate 31, and one end of the rectangular plate 31 is bent as shown in FIGS. 3A and 3B. As a result, as shown in FIG. 2A, the lead 33 has a top-plate portion 33c that is outward with respect to the outer periphery of the anode face 21b of the coin-type battery 21, in a direction along the anode face 21b. As shown in FIG. 2B, the top-plate portion 33c is substantially orthogonal to the anode face 21b of the coin-type battery 21. This structure enables the top-plate portion 33c to be used as a grip/handle. As described later, this structure is applicable to, for example, automating steps for mounting a lead-attached coin-type battery 30 to the PC board 10. Note that the lead-attached coin-type battery 30 is not shown in cross-section except a bent portion 33a. FIG. 2B includes a partial enlarged view of a vicinity of the bent portion 33a.

As shown in FIG. 2A, the bent portion 33a has been formed in the lead 33 by cutting and bending a portion of the lead 33 closer to the center thereof than a bottom portion 33b. An elongated aperture 33d has been provided in a main face of the bent portion 33a. A plating layer 320 has been formed on a wide area of the bent portion 33a, including the main face thereof and inner walls of the aperture 33d (see FIGS. 3A and 3B. The plating layer 320 is used for favorable solder bonding when mounting the lead-attached coin-type battery 30 to the PC board 10.

The following describes steps for forming the bent portion, which is one part of the manufacturing method for the lead 33.

As shown in FIG. 3A, the aperture 33d is provided in the rectangular plate 31 that is the constituent material of the lead 33. Specifically, the aperture 33d is provided in a portion of the main face of the rectangular plate 31 closer to the bottom portion 33b than the center. Plating processing is performed in a vicinity of the aperture 33d, and the plating layer 320 is formed on the inner walls of the aperture 33d as well. The portion in which the aperture 33d has been provided and on which the plating layer 320 has been formed is then cut and bent, thus forming the bent portion 33a provided with the aperture 33d as shown in FIG. 3B.

One advantage of the above manufacturing method in which the cutting and bending is performed after the plating processing is that even if the manufacturing method must be temporarily stopped, the plated rectangular plate 31 can be stored in a flat state, which facilitates the management of the rectangular plate 31, that is to say, the management of the bent portion 33a. In other words, the above manufacturing method avoids the danger of damaging the bent portion 33a during storage. The present embodiment therefore has the effect of improving yield of the lead-attached coin-type battery 30.

Since the bent portion 33a of the lead 33 is formed by cutting and bending after plating processing has been performed, a plating layer has not been formed on outer surfaces of the bent portion 33a that have become externally exposed due to the cutting and bending. However, since the plating layer 320 has been formed on the inner walls of the aperture 33d, the solder 15 is attached three-dimensionally to the main face of the bent portion 33a and the inner walls of the aperture 33d (see the partial enlarged view in FIG. 2B) when the lead-attached coin-type battery 30 is mounted to the PC board 10. This prevents insufficient bonding strength with the solder 15.

Automated Mounting Procedure

A characteristic feature of the present embodiment is that the manufacturing steps performed by hand by an operator in the manufacturing method for the mounting board of embodiment 1 can instead be performed automatically by a mounting apparatus. The following describes the automated mounting method.

In the automatic mounting method, the operator stores, in advance, the lead-attached coin-type battery 30 in a tray (not depicted), and supplies the tray to the mounting apparatus. The operator also, in advance, applies the solder 14 and 15 to the conductive lands 12 and 13 on the edges of the aperture 11 provided in the PC board 10, and supplies the PC board 10 to the mounting apparatus (not depicted).

Figure 4:
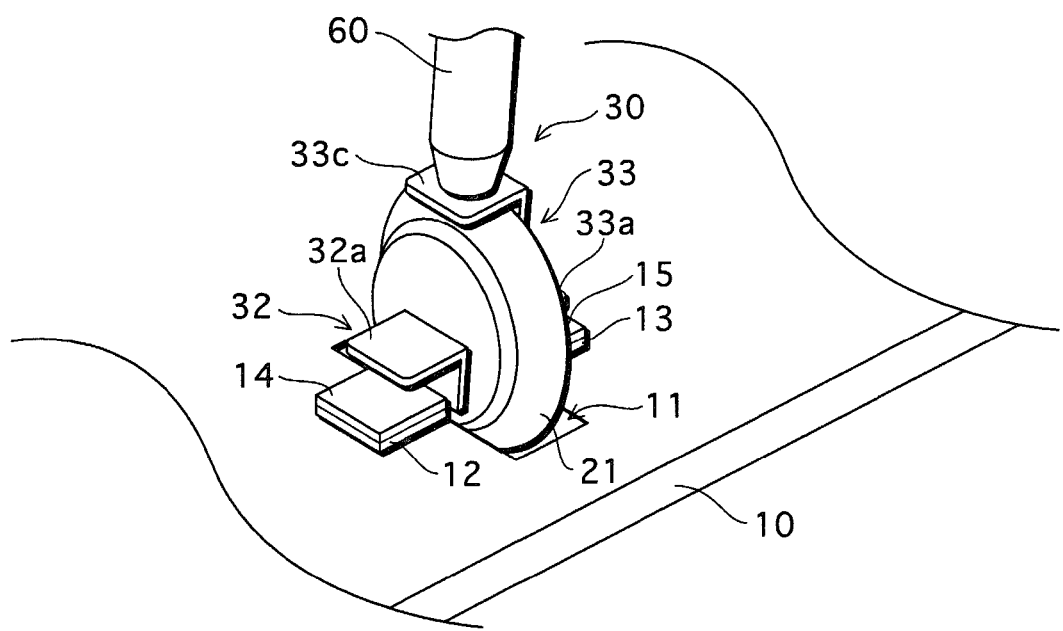
FIG. 4 shows a relevant step in a method for mounting the lead-attached coin-type battery of embodiment 2 to a PC board.

When the operator causes the mounting apparatus to begin operating, a suction nozzle 60 (see FIG. 4) of the mounting apparatus descends toward the tray, and the top-plate portion 33c of the lead-attached coin-type battery 30 in the tray is suctioned by the nozzle 60. The suction nozzle 60 then ascends with the top-plate portion 33c attached by suction, thereby lifting the lead-attached coin-type battery 30. The suction nozzle 60 then moves the suctioned lead-attached coin-type battery 30 over the PC board 10 (over the aperture 11 of the PC board 10). After moving to a position over the aperture 11, the suction nozzle 60 descends toward the aperture 11 as shown in FIG. 4.

As a result of this series of operations, the coin-type battery 21 is partially inserted into the aperture 11 of the PC board 10 so that the bent portions 32a and 33a of the leads 32 and 33 oppose the main faces of the solder 14 and 15 respectively.

Along with the insertion operation, the bent portions 32a and 33a of the leads 32 and 33 come into contact with the solder 14 and 15. While maintaining such contact, the operator inserts the PC board 10 into a reflow furnace, and performs heating at a predetermined temperature in the reflow furnace to melt the solder 14 and 15 on the PC board 10. After a predetermined time has elapsed, the operator removes the PC board 10 from the reflow furnace, and the solder 14 and 15 hardens. This completes the soldering work.

Employing the above-described automated mounting method using the top-plate portion 33c as a grip/handle enables efficiently and reliably mounting the lead-attached coin-type battery 30 to the PC board 10, and reduces production time.

Figure 5:
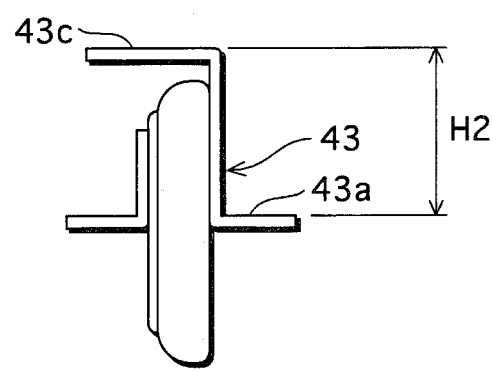
FIG. 5 is an elevation view showing a first variation of the lead-attached coin-type battery of embodiment 2.
Figure 6:
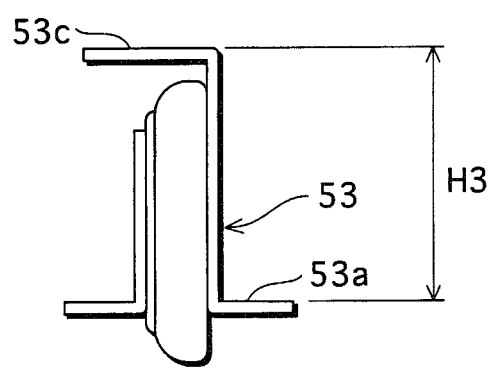
FIG. 6 is an elevation view showing a second variation of the lead-attached coin-type battery of embodiment 2.

FIG. 5 and FIG. 6 show a first variation and a second variation respectively of the lead-attached coin-type battery of the present embodiment. As shown in FIGS. 5 and 6, bent portions 43a and 53a of leads 43 and 53 have been formed by bending processing instead of being cut. In these variations, the distances H2 and H3 from the top-plate portions to the bent portions in FIG. 5 and FIG. 6 are longer than the distance H1 of the lead 33 (see FIG. 2A).

Embodiment 3

A main feature of the present embodiment is that the angle between the bent portion of the leads and the cathode face or anode face of the coin-type battery (i.e., the angle between the main face of the PC board 10 and the cathode face or anode face) is different from embodiment 1.

Figure 7:
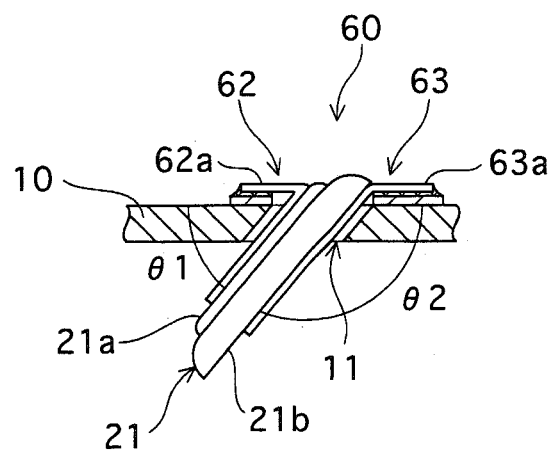
FIG. 7 is a partial cross-sectional view of a mounting board pertaining to embodiment 3.
Figure 8:
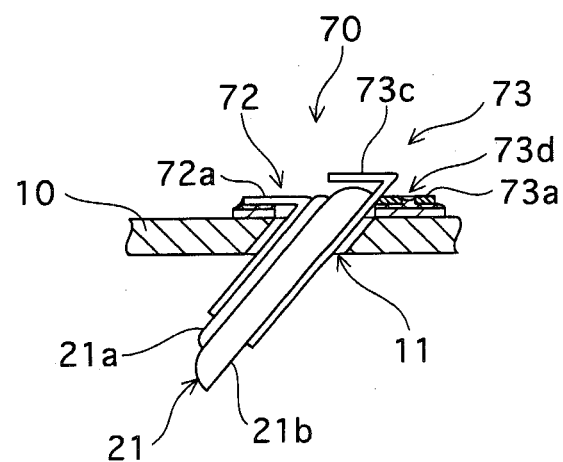
FIG. 8 is a partial cross-sectional view of a mounting board pertaining to embodiment 4.

In the present embodiment, as shown in FIG. 7, an angle $\theta 1$ between the main face of the PC board 10 and the cathode face 21a of the coin-type battery 21 has been set to an acute angle, and an angle $\theta 2$ between the main face of the PC board 10 and the anode face 21b of the coin-type battery 21 has been set to an obtuse angle (note that the sum of angle $\theta 1$ and angle $\theta 2$ is set to equal 180[°], and bent portions 62a and 63a both have horizontal surfaces).

As a result of this innovation in the present embodiment, the cathode face 21a and anode face 21b of the coin-type battery 21 are inclined with respect to the main face of the PC board 10. Even if, for example, the coin-type battery 21 has a relatively large diameter, the structure of the present embodiment enables effectively reducing the bulk of the coin-type battery 21 in the thickness direction of the mounting board 1. The present embodiment therefore prevents an increase in the envelope volume of the mounting board 1 even when using a large coin-type battery. Accordingly, the present embodiment has the advantage of enabling an optimal coin-type battery 21 to be selected from a wide range of battery configurations and sizes.

Embodiment 4

The present embodiment is similar to embodiment 3 in that the coin-type battery 21 is arranged at an incline with respect to the PC board 10 with use of leads 72 and 73, but differs from embodiment 3 in that, similarly to embodiment 2, a bent portion 73a is formed by cutting and bending the material of the lead 73, an aperture 73d is provided in the bent portion 73a, and a top-plate portion 73c is provided.

Similarly to embodiment 3, this innovation in the present embodiment has the advantage of preventing an increase in the envelope volume of the mounting board 1 and enabling an optimal coin-type battery 21 to be selected from a wide range of options.

Additionally, the present embodiment has the same advantage as embodiment 2, in that the top-plate portion 73c can be used as a grip/handle. Specifically, a lead-attached coin-type battery 70 can be efficiently and reliably mounted on the PC board 10 by using the nozzle 60 of the mounting apparatus in the automated mounting method, thereby reducing the production time. The effects of the present embodiment are very beneficial in view of efficiently mass-producing the mounting board 1 that meets the demand for a reduced size.

Moreover, in the present embodiment, a plating layer can be formed on the inner walls of the aperture 73d, similarly to embodiment 2. Since the bent portion 73a provided with the aperture 73d is cut and bent after the plating processing has been performed, the lead 73 can be stored in a flat state after the plating processing has been performed, thereby avoiding the danger of damaging the bent portion 73a during storage. The present embodiment therefore has the effect of improving the yield of a lead-attached coin-type battery and mounting board that meet the demand for a reduced size.

Note that the phrase "horizontal surface" refers to a substantially horizontal surface. Accordingly, the present embodiment includes a structure in which portions of the bent portions 62a and 63a each have a substantially horizontal surface.

Supplementary Remark

Figure 9A:
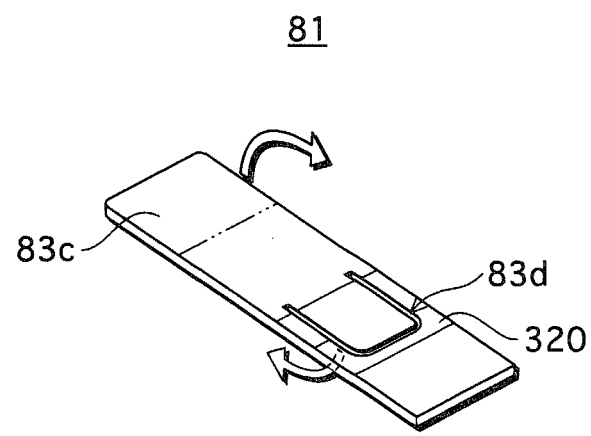
FIG. 9A shows a relevant step in a manufacturing method for a variation of a lead including a top-plate portion.
Figure 9B:
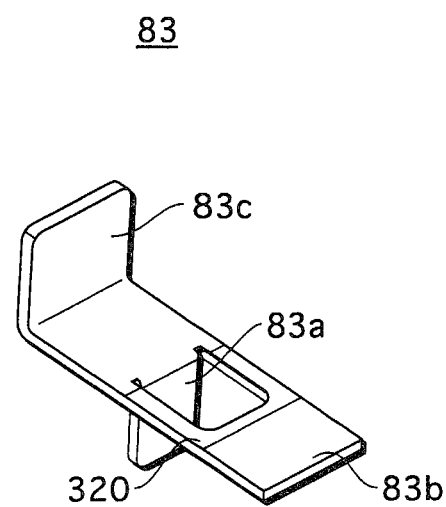
FIG. 9B shows a completed lead.

Although the elongated apertures 33d and 73d are provided in the leads 33 and 73 of embodiments 2 and 4, the configuration of the apertures is not limited to this. For example, as shown in FIG. 9, a curved aperture (here, a "U" shaped aperture 83d) may be provided along the periphery of a portion of a rectangular plate 81 that is to be the bent portion. Employing the aperture 83d facilitates the process of bending the portion that is to be the bent portion. Also, since the aperture is linear, aperture inner walls that are effective for soldering can be formed without cutting away a large portion of the material. The area of a bent portion 83a can therefore be sufficiently maintained, thereby contributing to favorable solder bonding strength.

Although the above embodiments describe cases in which there is only one coin-type battery 21, a stack may be formed by stacking a plurality of coin-type batteries, and leads can be attached to the cathode face and anode face of the stack.

Although the above embodiments describe exemplary cases in which the positions of the main faces of the bent portions exist on the same virtual plane, the positions of the main faces can be arranged to be uneven.

Although a coin-type battery has been described as the electrical element in the above embodiments, the electrical element of the present invention is not limited to this. The electrical element may be another electrical element such as a flat-type backup capacitor.

INDUSTRIAL APPLICABILITY

The present invention is widely applicable, especially in the field of PC boards for which a reduced size is in high demand. The present invention enables an optimal electrical element such as a coin-type battery to be selected from a wide range of configurations and sizes, as well as facilitates rework without inhibiting a reduction in size. The present invention is therefore highly industrially applicable.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A mounting board comprising:
a printed circuit board having two conductive lands provided on a surface thereof, and having an aperture provided in a thickness direction of the printed circuit board;
an electrical element that is flat in shape and has two surfaces, each surface being provided with an electrode face; and
two leads, each including (i) a main portion that is bonded to a respective one of the electrode faces and (ii) a bent portion that is inclined with respect to the main portion and is bonded to a respective one of the conductive lands, wherein the electrical element has been inserted into the aperture and is suspended therein by the two leads, wherein
at least one of the leads further includes an extending portion that extends to an area outward of a periphery of each electrode face, and
the extending portion includes a top-plate portion that has been formed by bending an end of the extending portion in a direction that intersects an extending direction of the extending portion.

2. The mounting board of claim 1, wherein
the bent portions of the leads each have a substantially horizontal surface.

3. The mounting board of claim 1, wherein
each of the bent portions has been bonded to the respective one of the conductive lands by solder.

4. A mounting board comprising:
a printed circuit board having two conductive lands provided on a surface thereof, and having an aperture provided in a thickness direction of the printed circuit board;
an electrical element that is flat in shape and has two surfaces, each surface being provided with an electrode face; and
two leads, each including (i) a main portion that is bonded to a respective one of the electrode faces and (ii) a bent portion that is inclined with respect to the main portion and is bonded to a respective one of the conductive lands, wherein the electrical element has been inserted into the aperture and is suspended therein by the two leads, wherein
the bent portion of at least one of the leads has been formed by cutting and bending a rectangular plate, the bent portion of the at least one of the leads has an aperture provided therein, and
a plating layer has been formed on a main face of the bent portion of the at least one of the leads and on an inner wall of the aperture provided therein.

5. The mounting board of claim 4, wherein
the bent portions of the leads each have a substantially horizontal surface.

6. The mounting board of claim 4, wherein
each of the bent portions has been bonded to the respective one of the conductive lands by solder.

7. A mounting board comprising:
a printed circuit board having two conductive lands provided on a surface thereof, and having an aperture provided in a thickness direction of the printed circuit board;
an electrical element that is flat in shape and has two surfaces, each surface being provided with an electrode face; and
two leads, each including (i) a main portion that is bonded to a respective one of the electrode faces and (ii) a bent portion that is inclined with respect to the main portion and is bonded to a respective one of the conductive lands, wherein the electrical element has been inserted into the aperture and is suspended therein by the two leads, wherein
the electrical element is a coin-type battery.

8. The mounting board of claim 7, wherein
the bent portions of the leads each have a substantially horizontal surface.

9. The mounting board of claim 7, wherein
each of the bent portions has been bonded to the respective one of the conductive lands by solder.

10. A lead-attached electrical element comprising:
an electrical element that is flat in shape and has two surfaces, each surface provided with an electrode face; and
two leads, each including (i) a main portion bonded to a respective one of the electrode faces and (ii) a bent portion inclined with respect to the main portion,
wherein the electrical element is a coin-type battery,
wherein at least one of the leads has the bent portion and forms an acute angle with the main portion, and
the bent portion is plate-shaped and includes a substantially horizontal surface.

* * * * *